(12) United States Patent
Ogawa et al.

(10) Patent No.: US 9,793,343 B2
(45) Date of Patent: Oct. 17, 2017

(54) SEMICONDUCTOR DEVICE

(71) Applicant: FUJI ELECTRIC CO., LTD., Kanagawa (JP)

(72) Inventors: Eri Ogawa, Matsumoto (JP); Hiroki Wakimoto, Matsumoto (JP); Misaki Takahashi, Matsumoto (JP); Yuichi Onozawa, Matsumoto (JP)

(73) Assignee: FUJI ELECTRIC., LTD., Kanagawa (JP)

( * ) Notice: Subject to any disclaimer, the term of this patent is extended or adjusted under 35 U.S.C. 154(b) by 0 days.

(21) Appl. No.: 15/257,853

(22) Filed: Sep. 6, 2016

(65) Prior Publication Data

US 2017/0077217 A1 Mar. 16, 2017

(30) Foreign Application Priority Data

Sep. 16, 2015 (JP) .................. 2015-182760

(51) Int. Cl.
| | |
|---|---|
| H01L 29/94 | (2006.01) |
| H01L 29/06 | (2006.01) |
| H01L 29/08 | (2006.01) |
| H01L 29/40 | (2006.01) |
| H01L 29/739 | (2006.01) |
| H01L 29/78 | (2006.01) |
| H01L 29/10 | (2006.01) |

(52) U.S. Cl.
CPC ...... *H01L 29/0615* (2013.01); *H01L 29/0619* (2013.01); *H01L 29/08* (2013.01); *H01L 29/0834* (2013.01); *H01L 29/402* (2013.01); *H01L 29/7397* (2013.01); *H01L 29/1095* (2013.01); *H01L 29/7805* (2013.01); *H01L 29/7811* (2013.01)

(58) Field of Classification Search
CPC .................. H01L 29/404; H01L 29/0661
See application file for complete search history.

(56) References Cited

U.S. PATENT DOCUMENTS

| | | | |
|---|---|---|---|
| 5,859,446 A | 1/1999 | Nagasu et al. | |
| 2010/0084704 A1* | 4/2010 | Darwish | H01L 29/7811 257/330 |
| 2014/0367737 A1 | 12/2014 | Takahashi et al. | |
| 2015/0349144 A1 | 12/2015 | Kawano et al. | |

* cited by examiner

*Primary Examiner* — Samuel Gebremariam

(57) ABSTRACT

To improve withstand capability of a semiconductor device during reverse recovery, provided is a semiconductor device including a semiconductor substrate having a first conduction type; a first region having a second conduction type that is formed in a front surface of the semiconductor substrate; a second region having a second conduction type that is formed adjacent to the first region in the front surface of the semiconductor substrate and has a higher concentration than the first region; a third region having a second conduction type that is formed adjacent to the second region in the front surface of the semiconductor substrate and has a higher concentration than the second region; an insulating film that covers a portion of the second region and the third region; and an electrode connected to the second region and the first region that are not covered by the insulating film.

9 Claims, 5 Drawing Sheets

US 9,793,343 B2

SEMICONDUCTOR DEVICE

The contents of the following Japanese patent application are incorporated herein by reference:
NO. 2015-182760 filed in JP on Sep. 16, 2015.

BACKGROUND

1. Technical Field

The present invention relates to a semiconductor device.

2. Related Art

Conventionally, a structure is known in which withstand capability during reverse recovery is improved by covering the end portions of an anode region of a diode with an insulating film to isolate the end portions of the anode region from an anode electrode, as shown in Patent Document 1, for example.

Patent Document 1: Japanese Patent Application Publication No. H9-232597

In a semiconductor device, the withstand capability during reverse recovery is preferably further improved.

SUMMARY

According to a first aspect of the present invention, provided is a semiconductor device comprising a semiconductor substrate having a first conduction type. A first region having a second conduction type may be formed in a front surface of the semiconductor substrate. A second region having a second conduction type may be formed adjacent to the first region in the front surface of the semiconductor substrate and has a higher concentration than the first region. A third region having a second conduction type may be formed adjacent to the second region in the front surface of the semiconductor substrate and has a higher concentration than the second region. The semiconductor device may include an insulating film that covers a portion of the second region and the third region. The semiconductor device may include an electrode connected to the second region and the first region that are not covered by the insulating film.

The third region may be longer than the second region in an arrangement direction that is a direction in which the first region, the second region, and the third region are arranged. Length of the third region in the arrangement direction may be greater than or equal to 100 μm.

Length of the second region in contact with the electrode may be equal to length of the second region in contact with the insulating film in the arrangement direction. Length of the second region in contact with the insulating film may be greater than length of the second region in contact with the electrode in the arrangement direction.

The second region is p-type and an impurity concentration of the second region may be higher than a hole concentration injected into the second region during reverse recovery. The second region may be formed to a deeper position than the first region, as seen from the front surface of the semiconductor substrate. The third region may be formed to a deeper position than the second region, as seen from the front surface of the semiconductor substrate.

An impurity concentration of the first region may be greater than or equal to $3.5 \times 10^{16}$ cm$^{-3}$ and less than or equal to $4.5 \times 10^{16}$ cm$^{-3}$. An impurity concentration of the second region may be greater than or equal to $1.0 \times 10^{17}$ cm$^{-3}$ and less than or equal to $2.0 \times 10^{17}$ cm$^{-3}$. An impurity concentration of the third region may be greater than or equal to $3.5 \times 10^{18}$ cm$^{-3}$ and less than or equal to $4.5 \times 10^{18}$ cm$^{-3}$.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
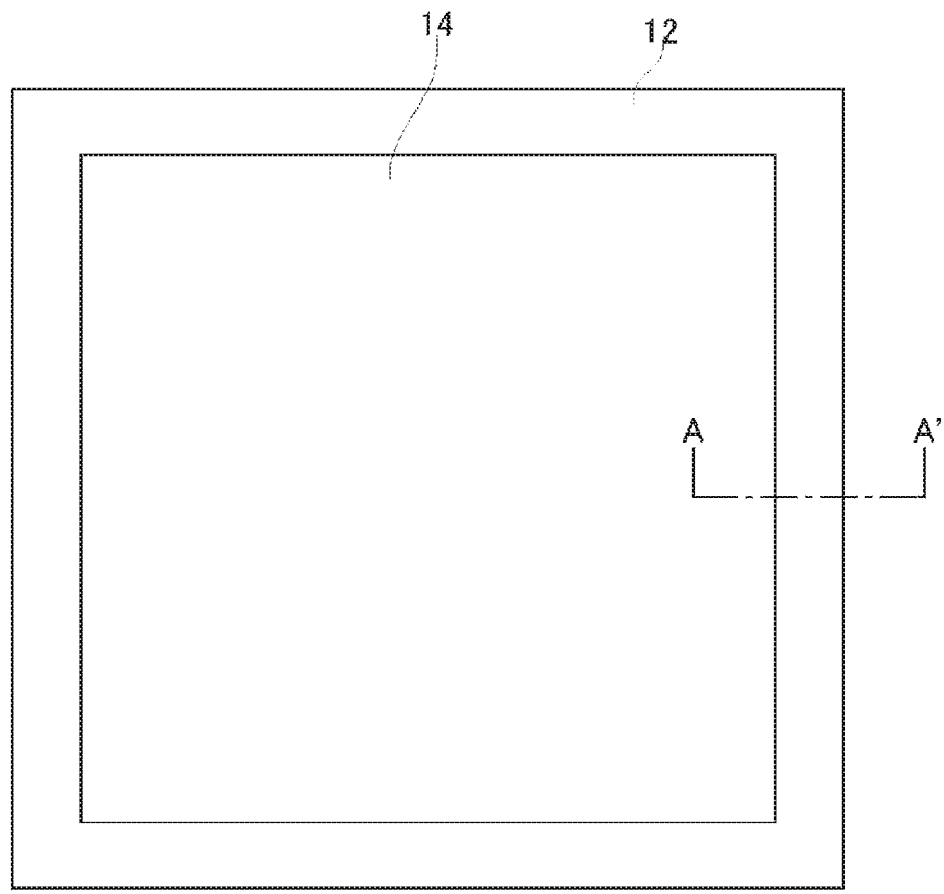
FIG. 1 shows an exemplary front surface structure of a semiconductor device 100.

FIG. 1 shows an exemplary front surface structure of a semiconductor device 100. The semiconductor device 100 includes an active region 14 and an edge termination structure region 12. The active region 14 has semiconductor elements such as an IGBT (Insulated Gate Bipolar Transistor) and an FWD (Free Wheeling Diode), for example, formed thereon. The active region 14 may refer to a region where an operational current such as a collector current flows when the semiconductor element is operating.

The edge termination structure region 12 is provided adjacent to the active region 14. For example, the edge termination structure region 12 is provided surrounding the active region 14. The edge termination structure region 12 is provided with a guard ring, a field plate, or the like and weakens the focusing of the electric field at the end portions of the active region 14.

Figure 2:
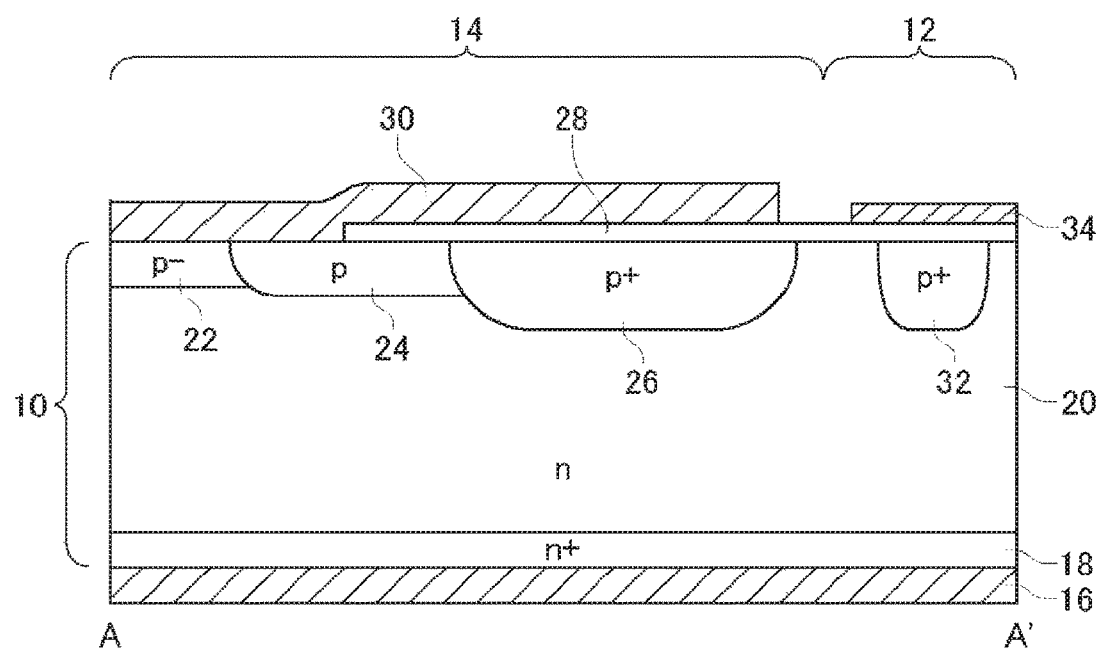
FIG. 2 shows an exemplary A-A' cross section of FIG. 1.

FIG. 2 shows an exemplary A-A' cross section of FIG. 1. The semiconductor device 100 includes a semiconductor substrate 10, a front surface electrode 30, a field plate 34, an insulating film 28, and a back surface electrode 16 in this cross section.

The semiconductor substrate 10 having a first conduction type includes a first region 22 having a second conduction type. In this example, the first conduction type is n-type and the second conduction type is p-type, but instead the first conduction type may be p-type and the second conduction type may be n-type. The first region 22 is formed on the front surface of the semiconductor substrate 10 in the active region 14. For example, the first region 22 is an anode region of an FWD.

The semiconductor substrate 10 includes a p-type second region 24 with a higher concentration than the first region 22. The second region 24 is formed adjacent to the first region 22 in the front surface of the semiconductor substrate 10. The second region 24 in this example is provided between the first region 22 and the edge termination structure region 12. The second region 24 may be formed surrounding the first region 22 in the front surface of the semiconductor substrate 10.

The semiconductor substrate 10 includes a p-type third region 26 with a higher concentration than the second region 24. The third region 26 is formed adjacent to the second region 24 in the front surface of the semiconductor substrate 10. The third region 26 in this example is provided between the second region 24 and the edge termination structure region 12. The third region 26 may be formed surrounding the second region 24 in the front surface of the semiconductor substrate 10.

In other words, in the cross section that is perpendicular to the front surface of the semiconductor device 100, the first region 22, the second region 24, and the third region 26 are arranged in order in a direction from the center of the semiconductor substrate 10 to the end portion of the semiconductor substrate 10. In this Specification, the direction in which the first region 22, the second region 24, and the third region 26 are arranged is referred to as the arrangement direction.

As described above, the semiconductor device 100 may include a p+-type guard ring 32, a field plate 34, and the like in the edge termination structure region 12. The guard ring 32 in this example is provided surrounding the third region 26 closer to the end portion of the semiconductor substrate 10 than the third region 26. Furthermore, the field plate 34 is provided above the guard ring 32. The insulating film 28 is provided between the guard ring 32 and the field plate 34.

The semiconductor substrate 10 includes a drift region 20 and a back surface region 18. The drift region 20 is n-type and the back surface region 18 is n+-type. The drift region 20 may be an n-type region that remains in the semiconductor substrate 10 as a result of the first region 22, the second region 24, the third region 26, the back surface region 18, and the like not being formed there. The back surface region 18 is formed in the back surface of the semiconductor substrate 10. The back surface region 18 is a cathode region of an FWD, for example. A back surface electrode 16 is provided on the back surface side of the semiconductor substrate 10.

The insulating film 28 is provided in a manner to cover the third region 26 and a portion of the second region 24 on the front surface of the semiconductor substrate 10. The insulating film 28 covers the region of the second region 24 on the third region 26 side. In other words, the insulating film 28 exposes the region of the second region 24 on the first region 22 side. The insulating film 28 may cover the entire front surface of the third region 26. The insulating film 28 may expose at least a portion of the first region 22. The insulating film 28 may expose the entire front surface of the first region 22.

The front surface electrode 30 is provided on the front surface side of the semiconductor substrate 10. The front surface electrode 30 is connected to the first region 22 and the second region 24 not covered by the insulating film 28. The front surface electrode 30 in this example is also formed on top of the insulating film 28 covering the second region 24 and the third region 26.

Figure 3:
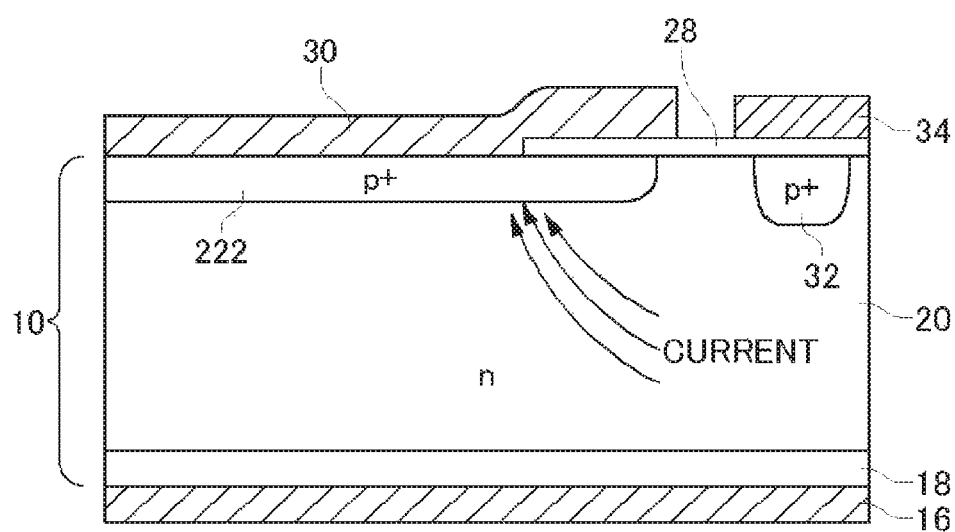
FIG. 3 shows a structure of a semiconductor device 200 used as a comparative example.

FIG. 3 shows a structure of a semiconductor device 200 used as a comparative example. The semiconductor device 200 includes a p+-type anode region 222 instead of the first region 22, the second region 24, and the third region 26 seen in the semiconductor device 100. The remaining structure is the same as that of the semiconductor device 100. The anode region 222 is formed in the front surface of the semiconductor substrate 10. The end portion of the anode region 222 is covered by the insulating film 28.

When a forward bias is applied to the semiconductor device 200, carriers are injected into the drift region 20 from the anode region 222. The carriers are also injected into the edge termination structure region outside the active region. In this state, when a reverse bias is applied to the semiconductor device 200, the carriers that have accumulated in the drift region 20 are ejected to the outside of the semiconductor device 200. At this time, if the entire anode region 222 is connected to the front surface electrode 30, the carriers accumulated in the edge termination structure region are focused at the end portion of the anode region 222, and a large current flows through the end portion of the anode region 222. Furthermore, it is relatively easy for the electric field to be focused at the end portion of the anode region 222. As a result, when a large current flows through the end portion of the anode region 222, the semiconductor device 200 breaks down easily.

In contrast to this, by covering the end portion of the anode region 222 with the insulating film 28, the electrical resistance of the anode region 222 covered by the insulating film 28 can be increased. As a result, the reverse recovery current caused by the carriers accumulated in the edge termination structure region flows toward the front surface electrode 30 without passing through the anode region 222 covered by the insulating film 28. In other words, the reverse recovery current caused by the carriers accumulated in the edge termination structure region is focused in the anode region 222 opposite the end portion covered by the insulating film 28. As a result, it is possible for the location where the reverse recovery current is focused to be different from the location where the electric field is focused, thereby improving the withstand capability of the semiconductor device 200 during reverse recovery.

However, when the impurity concentration of the anode region 222 is high, the amount of carriers injected into the drift region 20 from the anode region 222 during the forward bias increases. As a result, the peak current Irp during reverse recovery increases, and it becomes difficult to improve the withstand capability during reverse recovery.

On the other hand, when the impurity concentration of the anode region 222 is low, the peak current Irp during reverse recovery is small. However, in a case where the impurity concentration of the anode region 222 is low, the anode region 222 that is not covered by the insulating film 28 acts as if its conduction type has been inverted due to the carriers flowing into the anode region 222 during reverse recovery. As a result, it appears that the conduction type of the anode region 222 in contact with the front surface electrode 30 becomes different from the conduction type of the anode region 222 covered by the insulating film 28, and the electric field is focused at the boundary portion. As described above, since the reverse recovery current is also focused at this boundary portion, the semiconductor device 200 breaks down easily.

In this way, with the semiconductor device 200 shown in FIG. 3, it is difficult to both realize low carrier injection during a forward bias and cause the location where the electric field is focused during reverse recovery to be different from the location where the current is focused. Therefore, it is difficult to improve the withstand capability during reverse recovery.

On the other hand, with the semiconductor device 100 shown in FIG. 2, the impurity concentration of the first region 22, which primarily functions as the anode region, is lowered. Accordingly, the amount of carriers injected into the drift region 20 during the forward bias can be reduced.

In the semiconductor device 100, the p-type region (the second region 24 and the third region 26) covered by the insulating film 28 has a high impurity concentration, and therefore it is possible to prevent this region from having its conduction type appear to be inverted during reverse recovery. Therefore, the electric field is focused at the end portion of the third region 26 on the edge termination structure region 12 side. In this way, it is possible to make the location where the reverse recovery current is focused be different from the location where the electric field is focused.

In other words, with the semiconductor device 100, it is possible to both realize a low carrier amount injected during a forward bias and cause the location where the current is focused to be different from the location where the electric field is focused. As a result, the withstand capability of the semiconductor device 100 during reverse recovery can be improved. Furthermore, by providing the third region 26, it is possible to increase the distance between the location where the reverse recovery current is focused and the location where the electric field is focused, thereby further improving the withstand capability during reverse recovery.

Figure 4:
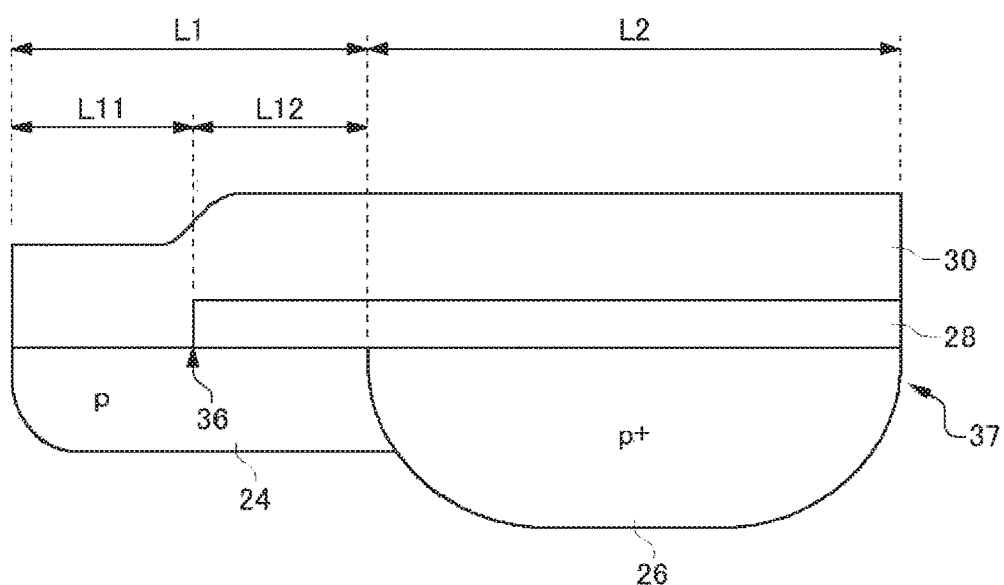
FIG. 4 is an enlarged view of the second region 24 and the third region 26.

FIG. 4 is an enlarged view of the second region 24 and the third region 26. In this example, the lengths of the second region 24 and the third region 26 in the arrangement direction are respectively L1 and L2. Here, L2 is preferably greater than L1. In this way, it is possible to increase the distance between the end portion 37 of the third region 26 on the edge termination structure region 12 side where the electric field is focused and the end portion 36 of the insulating film 28 on the first region 22 side where the current is focused.

As an example, L1 is greater than or equal to 60 μm and less than or equal to 120 μm. L1 may be greater than or equal to 80 μm and less than or equal to 100 μm. As an example, L2 may be greater than or equal to 100 μm. L2 may be greater than or equal to 140 μm. A larger value for L2 further improves the withstand capability of the semiconductor device 100, but also increases the chip size. L2 may be less than or equal to 200 μm, or may be less than or equal to 160 μm.

The length of the second region 24 in contact with the front surface electrode 30 in the arrangement direction is L11, and the length of the second region 24 covered by the insulating film 28 in the arrangement direction is L12. Here, L11 and L12 may be equal. However, it should be noted that "equal" does not necessarily mean that the lengths are exactly matching, and these lengths are considered to be equal as long as the error is within a range of ±10%. Furthermore, L12 may be greater than L11. By making L12 greater, it is possible to further increase the distance between the end portion 37 of the third region 26 and the end portion 36 of the insulating film 28. L11 may be smaller than L2. L12 may be smaller than L2.

As an example, L11 may be greater than or equal to 30 μm and less than or equal to 60 μm. When the length L11 across which the second region 24 having a relatively high concentration contacts the front surface electrode 30 is increased, the amount of carriers injected into the drift region 20 during a forward bias increases, and therefore L11 is preferably less than or equal to 50 μm. Furthermore, when L11 is decreased, the current is focused in a smaller region during reverse recovery, and therefore L11 is preferably greater than or equal to 40 μm.

As an example, L12 may be greater than or equal to 30 μm and less than or equal to 60 μm. L12 may be less than or equal to 50 μm. When the length L12 of the second region 24 in contact with the insulating film 28 is decreased, the resistance value of the second region 24 becomes lower and current flows more easily. Therefore, L12 is preferably greater than or equal to 40 μm. In one embodiment, L11=50 μm, L12=50 μm, and L2=150 μm.

The impurity concentration in the second region 24 is preferably higher than the hole concentration injected into the second region 24 during reverse recovery. In this way, it is possible to prevent a portion of the second region 24 covered by the insulating film 28 from acting as an n-type region during reverse recovery.

The hole concentration injected into the second region 24 during reverse recovery may be a hole concentration in a condition of the semiconductor device 100 operating at a rated value. Furthermore, whether the impurity concentration of the second region 24 is higher than the injected hole concentration may be estimated based on whether the portion of the second region 24 covered by the insulating film 28 functions as an n-type region during reverse recovery.

The impurity concentration of the first region 22 may be greater than or equal to $3.5 \times 10^{16}$ cm$^{-3}$ and less than or equal to $4.5 \times 10^{16}$ cm$^{-3}$. In this way, it is possible to reduce the amount of carriers injected into the drift region 20 during a forward bias, and to reduce the peak current Irp during reverse recovery.

The impurity concentration of the second region 24 may be greater than or equal to $1.0 \times 10^{17}$ cm$^{-3}$ and less than or equal to $2.0 \times 10^{17}$ cm$^{-3}$. By making the second region 24 have a higher impurity concentration than the first region 22, it is possible to restrict the portion of the second region 24 covered by the insulating film 28 from becoming n-type during reverse recovery.

The impurity concentration of the third region 26 may be greater than or equal to $3.5 \times 10^{18}$ cm$^{-3}$ and less than or equal to $4.5 \times 10^{18}$ cm$^{-3}$. By making the third region 26 have a higher impurity concentration than the second region 24, it is possible to further reduce the current passing through the p-type region covered by the insulating film 28 during reverse recovery.

In one embodiment, the impurity concentration of the first region 22 is $4.0 \times 10^{16}$ cm$^{-3}$, the impurity concentration of the second region 24 is $1.2 \times 10^{17}$ cm$^{-3}$, and the impurity concentration of the third region 26 is $4.0 \times 10^{18}$ cm$^{-3}$. The impurity concentration of each region may be within ±10% of the corresponding impurity concentration of this embodiment.

The second region 24 may be formed to a deeper position than the first region 22. The third region 26 may be formed to a deeper position than the second region 24. The depth of each region refers to the depth from the front surface of the semiconductor substrate 10.

The depth of the first region 22 from the front surface of the semiconductor substrate 10 may be greater than or equal to 3.5 μm and less than or equal to 4.5 μm. The depth of the second region 24 from the front surface of the semiconductor substrate 10 may be greater than or equal to 3.7 μm and less than or equal to 4.7 μm. The depth of the third region 26 from the front surface of the semiconductor substrate 10 may be greater than or equal to 8.0 μm and less than or equal to 10.0 μm.

By forming the third region 26 to a greater depth, it is possible to increase the curvature radius of the end portion 37 of the third region 26 and to weaken the concentration of the electric field. The depth of the third region 26 may be at least double the depth of the first region 22, and may be at least double the depth of the second region 24. By increasing the depth of the third region 26, it is possible to focus the electric field in the second region 24.

In one embodiment, the depth of the first region 22 is 4.0 μm, the depth of the second region 24 is 4.2 μm, and the depth of the third region 26 is 9.0 μm. The difference in depth between the second region 24 and the third region 26 may be greater than the difference in depth between the first region 22 and the second region 24.

The following describes the basics of the semiconductor device 100 manufacturing method. In a prescribed step, the first region 22, the second region 24, and the third region 26 are formed in the surface of the semiconductor substrate 10. In this step, a prescribed concentration of impurities is injected into each region using a photomask and the impurities are activated. After impurities have been injected into all of the first region 22, the second region 24, and the third region 26, the impurities may be activated by performing thermal processing en masse.

In the step of injecting the impurities into the third region 26, impurities may also be injected into the guard ring 32. The impurity concentrations of the third region 26 and the guard ring 32 may be the same. Furthermore, the front surface electrode 30 having a prescribed pattern is formed after the insulating film 28 having a prescribed pattern is formed. In the step of forming the front surface electrode 30, the field plate 34 may further be formed. The materials and thicknesses of the front surface electrode 30 and the field plate 34 may be the same.

Next, ions are injected into the back surface of the semiconductor substrate 10 to form the back surface region 18. The back surface electrode 16 is also formed. Before each structure is formed on the back surface side of the semiconductor substrate 10, a protective layer or the like may be formed on the front surface side of the semiconductor substrate 10. Furthermore, the structures on the front surface side may be formed after forming the structures on the back surface side of the semiconductor substrate 10.

Figure 5:
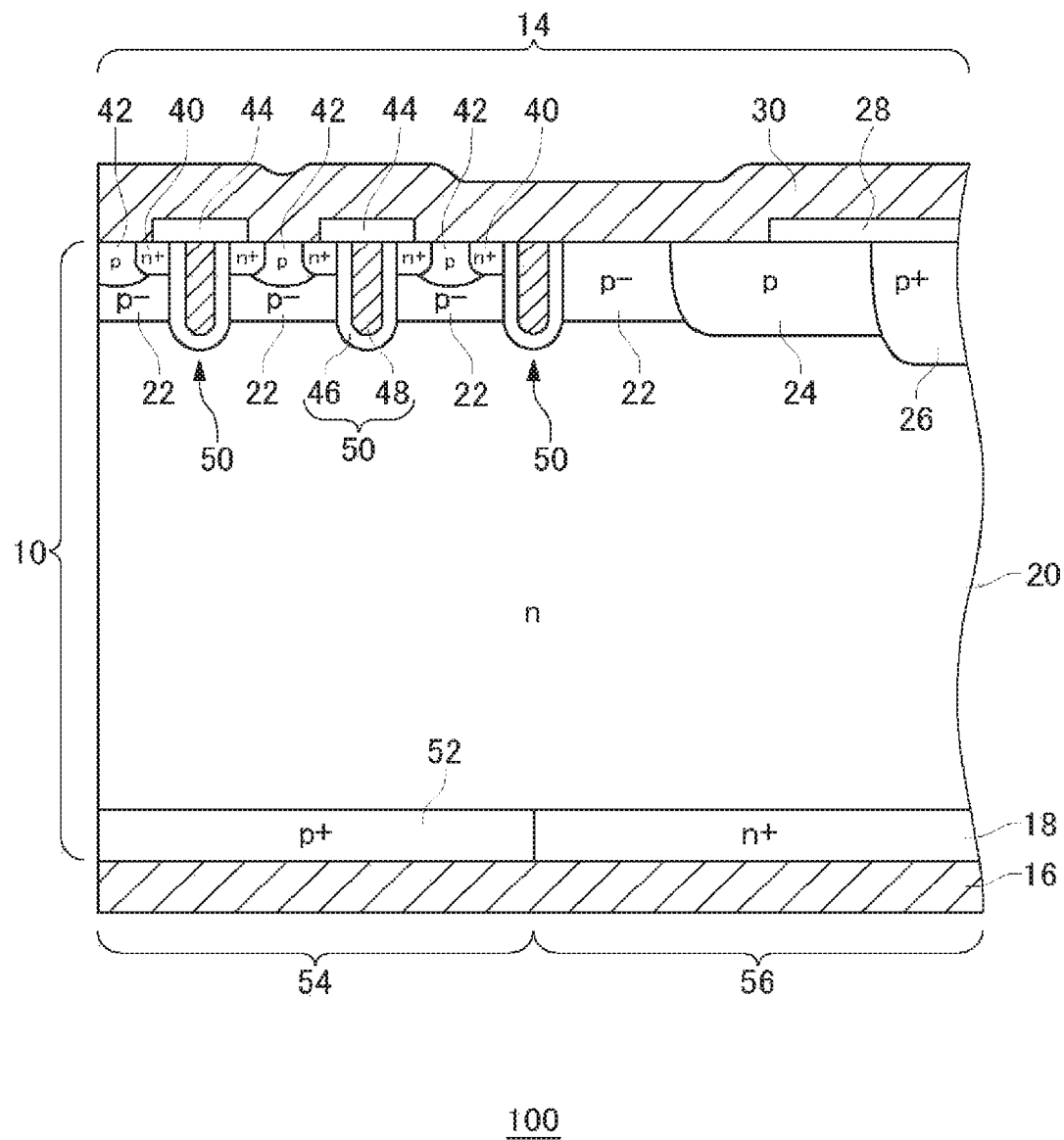
FIG. 5 shows another exemplary cross section of the active region 14 of the semiconductor device 100.

FIG. 5 shows another exemplary cross section of the active region 14 of the semiconductor device 100. The semiconductor device 100 of this example includes an IGBT region 54 and an FWD region 56 in the active region 14. The semiconductor device 100 has the same structures as shown in FIG. 2 in the FWD region 56.

In the IGBT region 54, the first region 22 is formed extending to the front surface of the semiconductor substrate 10. Furthermore, a plurality of gate trench portions 50 are provided that penetrate through the first region 22 from the front surface of the semiconductor substrate 10. Each gate trench portion 50 includes a trench insulating film 46 that covers the trench side walls and a trench electrode 48 that is surrounded by the trench insulating film 46 in the trench. Each gate trench portion 50 is isolated from the front surface electrode 30 by the interlayer insulating film 44. The third region 26 of the FWD region 56 may be formed to a deeper position than the gate trench portion 50.

A p-type contact region 42 with a higher concentration than the first region 22 and an n+-type emitter region 40 are formed on the surface of the first region 22 between each pair of gate trenches 50. In the IGBT region 54, a p+-type collector region 52 is provided on the back surface side of the drift region 20. A back surface electrode 16 is provided on the back surface of the collector region 52.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS

10: semiconductor substrate, 12: edge termination structure region, 14: active region, 16: back surface electrode, 18: back surface region, 20: drift region, 22: first region, 24: second region, 26: third region, 28: insulating film, 30: front surface electrode, 32: guard ring, 34: field plate, 36: end portion, 37: end portion, 40: emitter region, 42: contact region, 44: interlayer insulating film. 46: trench insulating film, 48: trench electrode, 50: gate trench portion, 52: collector region, 54: IGBT region, 56: FWD region, 100: semiconductor device, 200: semiconductor device, 222: anode region

What is claimed is:

1. A semiconductor device comprising:
a semiconductor substrate having a first conduction type;
a first region having a second conduction type that is formed in a front surface of the semiconductor substrate;
a second region having a second conduction type that is formed adjacent to the first region in the front surface of the semiconductor substrate and has a higher concentration than the first region;
a third region having a second conduction type that is formed adjacent to the second region in the front surface of the semiconductor substrate and has a higher concentration than the second region;
an insulating film that covers a portion of the second region and the third region; and
an electrode connected to the second region and the first region that are not covered by the insulating film;
wherein the first region, the second region, and the third region are arranged such that the first region is farthest from a termination region, the third region is closest to the termination region, and the second region is between the first region and the third region.

2. The semiconductor device according to claim 1, wherein
the third region is longer than the second region in an arrangement direction that is a direction in which the first region, the second region, and the third region are arranged.

3. The semiconductor device according to claim 2, wherein
length of the third region in the arrangement direction is greater than or equal to 100 μm.

4. The semiconductor device according to claim 2, wherein
length of the second region in contact with the electrode is equal to length of the second region in contact with the insulating film in the arrangement direction.

5. The semiconductor device according to claim 2, wherein
length of the second region in contact with the insulating film is greater than length of the second region in contact with the electrode in the arrangement direction.

6. The semiconductor device according to claim 2, wherein
an impurity concentration of the first region is greater than or equal to $3.5\times10^{16}$ cm$^{-3}$ and less than or equal to $4.5\times10^{16}$ cm$^{-3}$,
an impurity concentration of the second region is greater than or equal to $1.0\times10^{17}$ cm$^{-3}$ and less than or equal to $2.0\times10^{17}$ cm$^{-3}$, and
an impurity concentration of the third region is greater than or equal to $3.5\times10^{18}$ cm$^{-3}$ and less than or equal to $4.5\times10^{18}$ cm$^{-3}$.

7. The semiconductor device according to claim 1, wherein the second region is p-type and an impurity concentration of the second region is higher than a hole concentration injected into the second region during reverse recovery.

8. The semiconductor device according to claim 1, wherein the second region is formed to a deeper position than the first region, as seen from the front surface of the semiconductor substrate.

9. The semiconductor device according to claim 1, wherein the third region is formed to a deeper position than the second region, as seen from the front surface of the semiconductor substrate.

\* \* \* \* \*